US007545646B2

(12) United States Patent
Holmberg et al.

(10) Patent No.: US 7,545,646 B2
(45) Date of Patent: Jun. 9, 2009

(54) COOLING ASSEMBLY (75) Inventors: Per Anders Holmberg, Stockholm (SE);
Ulf Eric Andretzky, Huddinge (SE)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 0 days.

(21) Appl. No.: 11/917,669

(22) PCT Filed: Jun. 23, 2005

(86) PCT No.: PCT/SE2005/001008

§ 371 (c)(1),
(2), (4) Date: Dec. 14, 2007

(87) PCT Pub. No.: WO2006/137763

PCT Pub. Date: Dec. 28, 2006

(65) Prior Publication Data
US 2008/0198554 A1    Aug. 21, 2008

(51) Int. Cl.
*H05K 7/20* (2006.01)
*H01L 23/36* (2006.01)

(52) U.S. Cl. .............. 361/701; 361/687; 361/700; 165/80.2; 165/80.3; 165/80.5

(58) Field of Classification Search ............ 361/687, 361/690–697, 700–712, 715, 719; 165/80.2–80.5, 165/104.21, 104.26, 104.33, 185; 174/15.2, 174/16.3, 252; 257/707, 714, 715, 718, 719, 257/727; 29/890.032, 890.04, 890.041–890.046
See application file for complete search history.

(56) References Cited

U.S. PATENT DOCUMENTS

| 6,137,681 | A  | * | 10/2000 | Lu ........................... 361/697 |
| 6,351,382 | B1 | * | 2/2002  | Nakanishi et al. ........... 361/700 |
| 6,650,540 | B2 | * | 11/2003 | Ishikawa .................... 361/695 |
| 6,661,660 | B2 | * | 12/2003 | Prasher et al. ............. 361/700 |
| 7,047,640 | B2 | * | 5/2006  | Lee et al. ................ 29/890.046 |

FOREIGN PATENT DOCUMENTS

JP          2004022786 A    *   1/2004

* cited by examiner

*Primary Examiner*—Michael V Datskovskiy (57) ABSTRACT

A cooling assembly and method of cooling a heat-generating electronic component on a circuit board. A heat collector collects heat from the electronic component. A heat pipe transfers the heat to a location remote from the electronic component. A heat sink is mounted to the circuit board at the distant location. The heat sink has at least one groove formed on an underside thereof. The heat sink is mounted so that is overlies the heat pipe and the heat pipe is introduced into the groove, thereby securing the heat pipe between the heat sink and the circuit board.

29 Claims, 5 Drawing Sheets

COOLING ASSEMBLY

TECHNICAL FIELD

The present invention generally concerns the cooling of heat generating electronic circuits and equipment.

BACKGROUND

A general trend in the different sectors of the electronics industry is that for each generation microprocessors, network processors, signal processors, ASICs and many other circuits show higher performance levels and require higher power. The most critical part of circuit board thermal design is now handling the Hot-Spots, in the form of fewer but hotter components.

Heat pipes are known to be a very good but expensive solution for handling heat transfer problems. The basic function of a heat pipe is that it moves heat from one place to another. In electronic systems heat pipes are used for transferring heat from a Hot Spot (such as a processor etc.) where the heat dissipation problem is hard to solve, and to a free space that can hold a large heat sink or is very near a fan. Heat pipes are now a mainstream technology used in most laptop computers and volume production has driven the price down. An ordinary heat pipe is now a standard product, available in several diameters and lengths from multiple manufacturers to a cost off less than a dollar. The cost can be expected to go down further in the near future as new manufacturing plants are set up and manufacturing volumes go up.

Until now, heat pipes have been a low volume niche technology for real high performance systems. They are now getting into the mainstream in the high volume segments. However, the problems with existing heat pipe design solutions are still the same as before, they are tailor-made for each design and they target optimal cooling efficiency rather than flexibility and ease of design.

SUMMARY

It is a general object of the present invention to provide an improved cooling assembly for cooling individual small series applications of electronic equipment as well as an improved method of manufacturing a low-cost, flexible cooling assembly for electronic equipment.

It is another general object of the invention to provide an improved method of designing such a cooling assembly for cooling individual small series applications of electronic equipment.

In particular it is an object of the invention to suggest a cost efficient way to provide flexibility in designing and manufacturing cooling assemblies using heat pipes to remove heat from heat-generating electronic equipment.

These and other objects are met by the invention as defined by the accompanying patent claims.

The invention generally relates to the removal of heat from heat-generating electronic equipment mounted on circuit boards by means of heat collectors attached to the equipment and in thermal contact with heat pipes transferring heat to heat sinks spaced from the equipment. It has been recognized that essentially improved, combined heat transfer and cost efficiency may be achieved by providing a simple and robust way of establishing good and reliable thermal contact between heat pipes and heat sinks. A basic idea is to use the circuit board itself for applying the pressure on the thermal interconnect by attaching heat sinks to the circuit board, overlying the heat pipes.

In accordance with a further aspect of the invention improved cost efficiency in the design and manufacture of cooling assemblies for small series production of such electronic equipment applications, may be obtained by optimizing the assembly for cost and flexibility while still maintaining excellent heat transfer efficiency. A basic idea of this aspect is to provide standardized and modular heat transfer components for such a cooling assembly. Such components primarily include standardized heat sinks that in the required number and/or size are attached as modules to the circuit board, overlying the heat pipes. Said components may likewise comprise standard type heat collectors for attachment to heat-generating equipment and/or heat pipes of standardized length and design for transferring heat from the heat collectors to the heat sinks.

By forming one or several continuous heat pipe receiving grooves in a bottom surface of the heat sink modules the heat sinks may be attached in optional positions as well as numbers to the circuit board, simultaneously securing the heat pipes to the circuit board.

In an embodiment that may be specifically preferable for space constrained applications it is preferable to use a heat sink area also on the backside of the circuit board. This is achieved by providing a heat sink consisting of upper and lower parts that are attached to the circuit board from either side and that between them secure the heat pipes to the circuit board.

In another embodiment a single profile of a suitable material is used for providing a standard range of modular heat sinks, thereby achieving heat sink solutions for a wide power range.

Preferably, a range of standard heat pipes is provided that includes not only straight pipes but also curved, U-shaped as well as S-shaped heat pipes. Including such heat pipe designs in a standard range not only greatly enhances the flexibility of designing the cooling assembly but also contributes to absorbing vibrations and shock.

A cooling solution according to the present invention offers a number of advantages, including:
- Simple and robust circuit board assembly;
- Allows for establishing good thermal contact between heat sink and heat pipe;
- Mechanically robust, thereby meeting requirements on vibration and shock;
- Minimizes design cost and reduces/eliminates tooling cost, thereby;
- Supporting low and medium volume products;
- Scalable in cooling capacity;
- Standardized parts allows for low cost manufacturing;
- Short time to market;
- Reusable solution that fits different chips;
- Very low profile to support dense board spacing in sub racks.

Advantages offered by the present invention, in addition to those described above, will be readily appreciated upon reading the below detailed description of embodiments of the invention.

BRIEF DESCRIPTION OF THE DRAWINGS

The invention, together with further objects and advantages thereof, will be best understood by reference to the following description taken together with the accompanying drawings, in which.

DETAILED DESCRIPTION

Figure 1A:
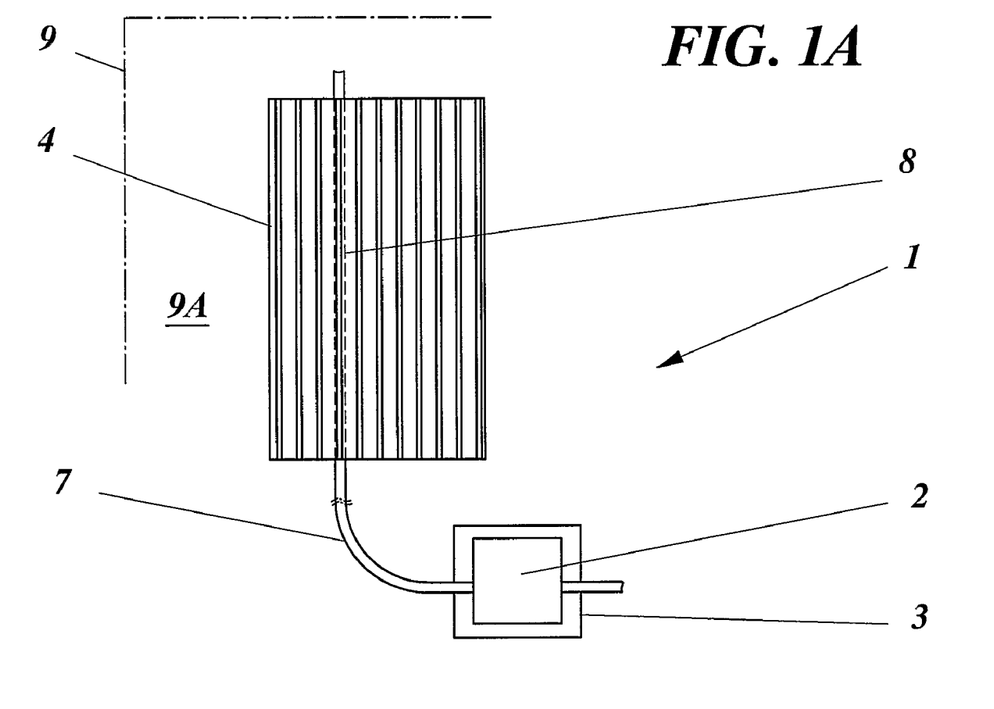
FIG. 1A is a partly schematical illustration of a first embodiment of a cooling assembly according to the invention, mounted on a circuit board.
Figure 1B:
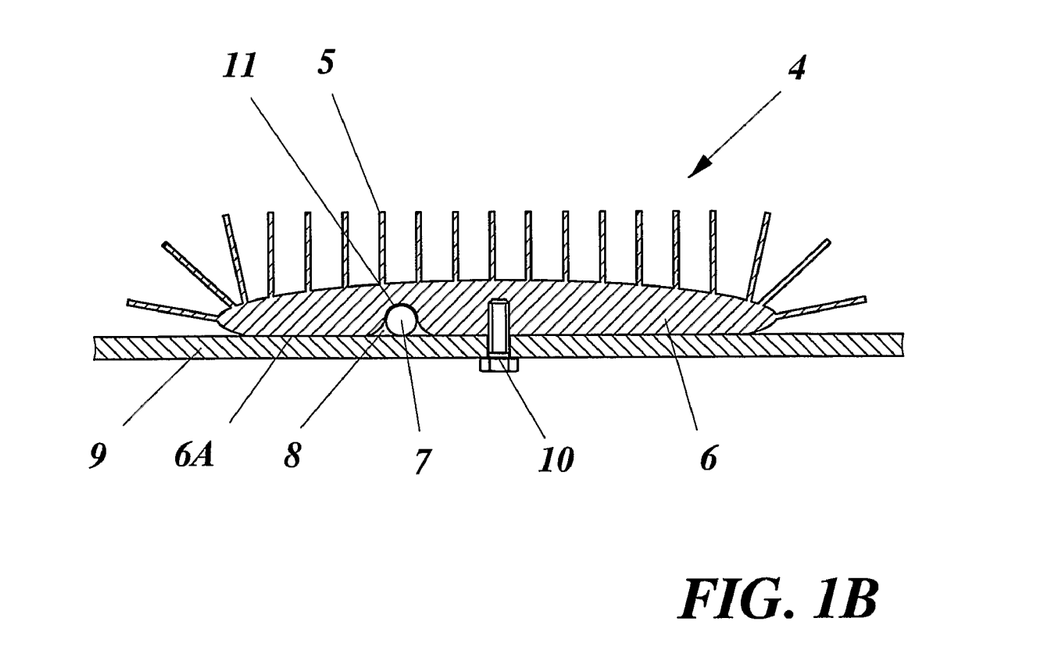
FIG. 1B is a partly schematical section through a standardized heat sink and heat pipe attached to the circuit board in the assembly of FIG. 1A.

The invention will now be explained with reference to exemplifying embodiments of the cooling assembly of the invention, which are illustrated in the accompanying drawing figures. A first exemplifying embodiment of the invention is illustrated in FIGS. 1A and B, and relates to an application of the inventive solution to a partially and very schematically outlined circuit board 9 containing at least one electronic component 3 in the form of a processor or other heat generating component. It shall be emphasized, though that the illustrations are for the purpose of describing preferred embodiments of the invention and are not intended to limit the invention to the details thereof.

In accordance with the invention the heat generated by the electronic component 3 is removed from the component and transferred to a free available space 9A on the circuit board 9 by means of a cooling assembly 1. Said cooling assembly 1 consists of a heat collector 2 that is attached to the electronic component 3, in thermal contact therewith. The heat generated by the component is transferred from the area of the component 3 by means of a heat pipe 7 that is positioned with a portion thereof in direct thermal contact with the heat collector 2. At another portion thereof the heat pipe 7 is positioned in thermal contact with a heat sink 4 that is attached to the circuit board 9 at the free space 9A, distant from the component.

Furthermore, in accordance with the invention, the heat collector 2 may be individually selected from a standard range of heat collectors. The size and design of the heat collector 2 is chosen for the specific application, in the applicable case dependent on the chip package, for example the height of the component 3. The heat pipe 7 and the heat sink 4 are likewise individually selected from a standard range of heat pipe sizes and designs and heat sink sizes and designs, respectively. Specifically, a standard range of heat sinks is provided wherein each heat sink 4 has at least one groove 8 formed in a bottom surface 6A of a body 6 thereof, said body 6 having cooling fins 5 provided on an opposite surface.

The groove 8 is extended continuously from one end of the heat sink 4 and to an opposite end thereof, and has a size adapted to the size of the heat pipe 7 of said standard range. Upon assembly, the selected heat sink 4 is attached to the circuit board 9, overlying the heat pipe 7 that is introduced into the corresponding groove 8. When mounted, the heat pipe 7 is therefore squeezed between the heat sink 4 and the circuit board 9. Thereby said heat pipe 7 is secured between the heat sink 4 and the circuit board 9 in direct thermal contact with the heat sink 4 as well as with the circuit board 9. For easy mounting, the heat sink 4 is simply screwed to the circuit board 9 by means of a screw or bolt 10, so that the circuit board 9 will itself in effect be used as one part of a fixture for holding the heat pipe 7. The screw 10 is preferably positioned a small distance from the heat pipe 7. The fact that the circuit board 9 is elastic and the tension built up in the material by tightening the screw 10, will be used to apply constant pressure to an applied, below described thermal interface material TIM, so that a good thermal contact will be secured throughout the lifetime of the assembly, even when it is subjected to vibration, shock etc. during transport and operation. This way of securing the heat sink 4 and the heat pipe 7 to the circuit board 9 is much more simple and robust than the use of a spring or flexible clip to apply force.

Thermal interface material TIM may be used between the heat pipe 7 and heat sink 4 and normally the groove 8 in the heat sink 4 is prepared with such a TIM 11 to simplify board assembly. In particular, in accordance with an advantageous further development of the inventive idea, the TIM 11 is pre-applied to the heat sink 4 and especially in the area of its groove. This means that the heat sink 4 is prepared before the actual assembly of the circuit board and its components. Such thermal interface material TIM may preferably also be provided between the heat pipe 7 and the circuit board 9, although not specifically illustrated here. By the direct contact between the heat pipe 7 and the circuit board 9, the circuit board 9 will itself work as an area extension and give some contribution to the cooling effect. The circuit board may also contribute to the heat dissipation in case there is some thermal contact to the power or ground plane, for example with thermal vias.

For the cooling assembly 1 of the invention, a standard range of heat collector sizes and designs, a standard range of heat pipe sizes and designs and a standard range of heat sink sizes and designs are first provided as modules. Then, the cooling capacity required for the specific application is calculated and the appropriate heat collector, heat sink and heat pipe sizes and designs for that application are individually selected. It will be realized that by means of the suggested individual selection and assembly of the parts of the cooling assembly 1, desired design flexibility is achieved without any loss of cooling capacity. The described solution is to use standard modular heat sink and heat pipe elements that can be added onto the circuit board 9 to achieve the required cooling capacity. By the manufacturing of a cooling assembly 1 of the invention, the heat pipe 7 and the heat sink 4 are assembled in a cost efficient way that allows for this flexibility. This is done mainly by defining standard components that are optimized for lowest cost of components rather than optimal efficiency and that are made an integrated part of the circuit board solution. In other words, parts of the cooling assembly 1 are assembled as part of the board production instead of the prior art use of pre-fabricated cooling assemblies for each board design. The manufacturing of such prior art tailor-made cooling assemblies will involve high design and tooling costs rendering the assembly expensive unless the manufacturing volumes are very high.

With the described cooling assembly 1 of the invention, the basic concept of the invention is embodied by a very low cost and flexible heat pipe cooling solution that takes heat pipes from being a niche technology to a standard design element in circuit board design. What makes this possible is on the one hand the higher integration of components that leaves free space on circuit boards for heat sinks, and on the other hand the low cost of the heat pipes.

Figure 2A:
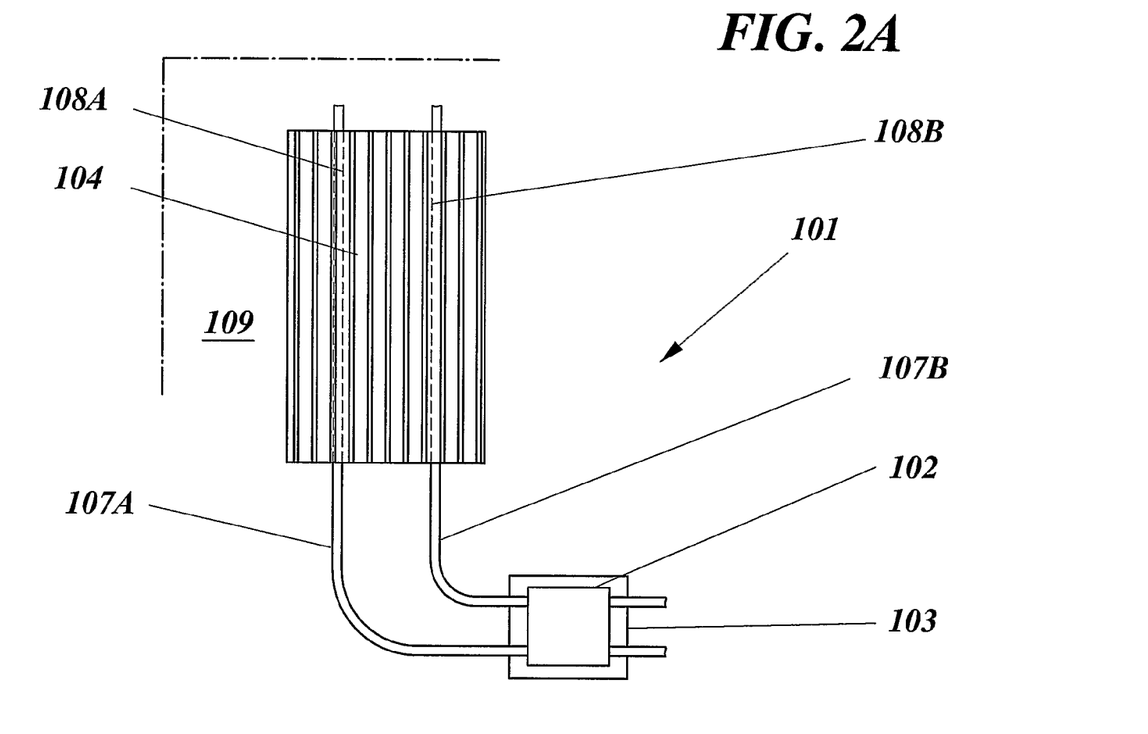
FIG. 2A is a partly schematical illustration of a second embodiment of a cooling assembly according to the invention, mounted on a circuit board.
Figure 2B:
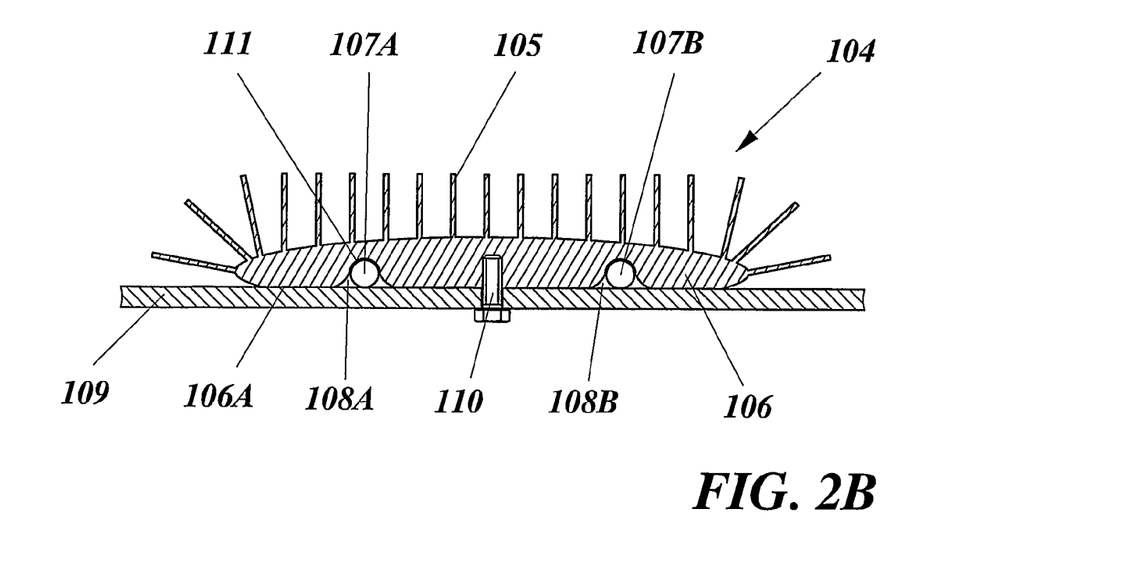
FIG. 2B is a partly schematical section through a standardized heat sink and heat pipes attached to the circuit board in the assembly of FIG. 2A.

Both the heat sink and the heat pipe elements have pricing that depends heavily on volume. Examples of heat pipe pricing show a considerable decrease in cost when going from a volume of 1000 to a volume of 100,000 items. In effect, in such a case the cost per item may be reduced to one third. This means that the ability to reuse the same components is much more important for cost than having an optimal thermal design. For example, it is better to use two heat pipes of a less efficient standardized design that are purchased in volume, than using one that is optimized. The size and number of heat pipes used for specific applications depends on the needed heat transfer capacity, as is exemplified in the second embodiment of the invention illustrated in FIGS. 2A-B as well as in the further exemplifying embodiments of FIGS. 3, 5A-B and 6A-G. In the embodiment of the cooling assembly 101 illustrated in FIGS. 2A-B, two heat pipes 107A and 107B are placed in thermal contact with the heat collector 102 on the component 103 and with the heat sink 104. In this case a bottom surface 106A of the heat sink 104 is provided with two spaced grooves 108A, 108B for receiving the two heat pipes 107A, 107B. Furthermore, the illustrated heat pipes 107A, 107B are curved to provide additional flexibility to sustain shock and vibration and differences in temperature expansion in the circuit board 109 and the heat pipes 107A-B in themselves.

Figure 3:
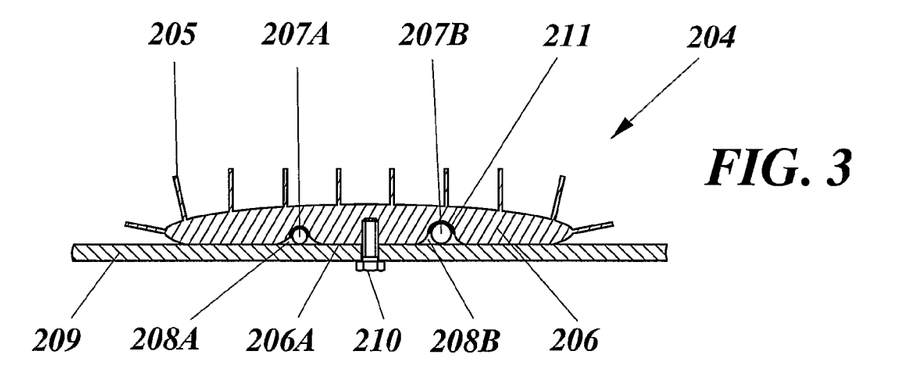
FIG. 3 is a partly schematical section of a third embodiment of a heat sink and heat pipes attached to a circuit board in an assembly according to the invention.

In FIG. 3 is illustrated a further embodiment of a heat sink 204 that is similar to the previously illustrated embodiments, except that it is provided with two grooves 208A and 208B having different size to allow for the flexibility of using heat pipes 207A and 207B of different size. Furthermore, this embodiment of the heat sink 204 is also used to exemplify that the heat sinks of the provided range may differ in the height of the cooling fins 205 extending from the main body 306 as well as in the pitch between the fins 205. The height of the fins 205 may be chosen depending on board pitch in a rack and the pitch between the fins 305 may be chosen depending on the available air speed.

Figure 4:
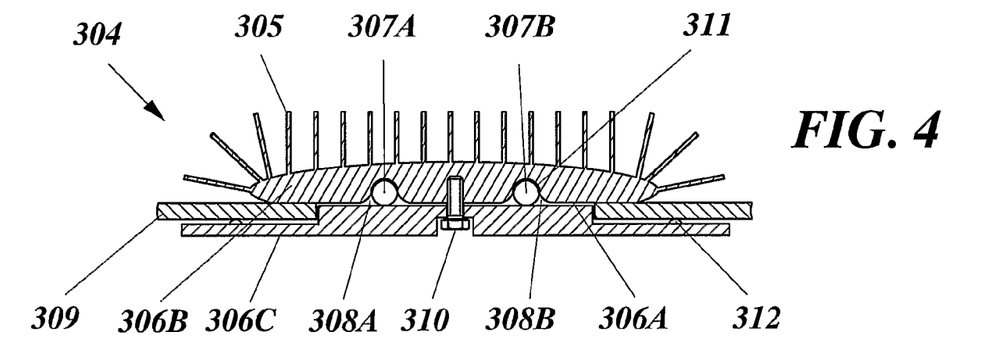
FIG. 4 is a partly schematical section of a forth embodiment of a heat sink and heat pipes attached to a circuit board in an assembly according to the invention.

In FIG. 4 is illustrated an alternative embodiment using a heat sink 304 that consists of two main body parts 306B and 306C of which the upper part 306B carries the cooling fins 305 on an upper surface and the heat pipe receiving grooves 308A-B on its lower surface 306A. The second heat sink part 306C is provided on the back of the printed circuit board 309 and is secured to the upper heat sink part 306B by means of a bolt 310 or other appropriate fastener. Depending on the available space it can be advantageous to have such a heat sink area also on the backside of the circuit board. To be efficient, the heat pipe should then be squeezed between the two parts 306B, 306C of the heat sink 304 in the illustrated manner. This provides for the best thermal connectivity. In the illustrated embodiment, an upper surface of the lower heat sink part 306C is provided with bosses 312 for contacting the backside of the circuit board 309. In this manner the flexibility of the heat sink material can be used to fasten the heat sink 304 to the circuit board 309, as is shown in the drawing figure. This mode of fastening is not critical for the operation but may be preferred for avoiding vibrations during transport etc.

Figure 5A:
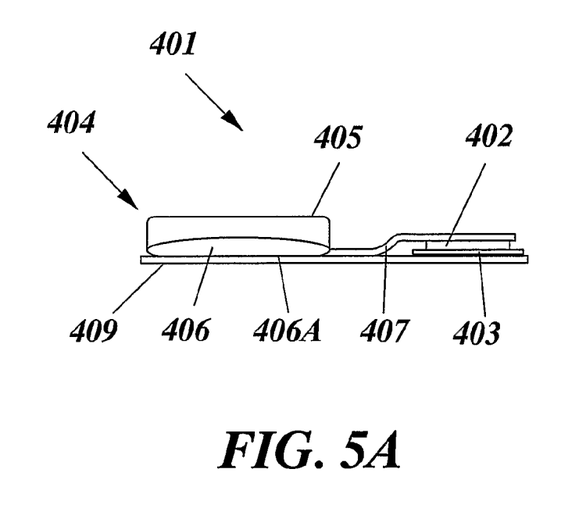
FIG. 5A is a partly schematical side view of an embodiment of a cooling assembly according to the invention, employing an S-shaped heat pipe.
Figure 5B:
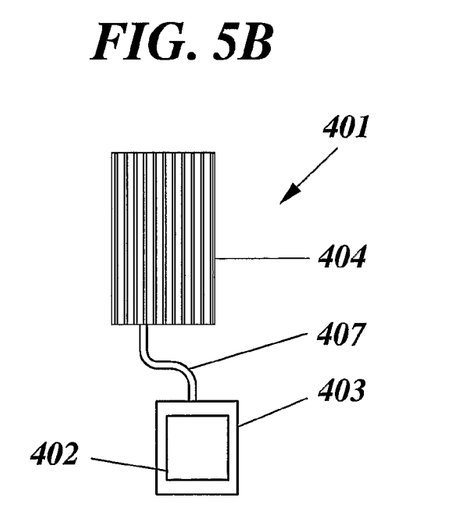
FIG. 5B is a schematical top view of the of the cooling assembly illustrated in FIG. 5A.

In the embodiment of the cooling assembly 401 illustrated in FIGS. 5A-B, an S-shaped curved heat pipe 407 is used to transfer heat from the heat generating component 403 and the heat collector 402 and to the heat sink 404. Such an S-shaped heat pipe 407 will block less air and will also make it possible to employ the same heat pipe for components having different height. It will also assist in absorbing vibration and shock.

The heat pipes may be provided in the same direction as the airflow, which will allow for the advantageous manufacturing of the heat sinks from extruded aluminum. Expressed otherwise, the grooves in the bottom surface of the heat sinks are preferably extended parallel to the heat sink cooling fins, which will allow for the extrusion of the heat sinks with the grooves. Any other orientation of the grooves would require subsequent machining of the grooves or casting of the entire heat sinks. Such alternatives would result in higher manufacturing costs and higher tooling costs, respectively. In a specifically preferred embodiment, a single aluminum profile can be used for achieving heat sink solutions for a wide power range. The profile is then cut up in several modular sizes so that heat sinks of different modular size may be combined for specific applications having specific cooling requirements. Providing such a modular, standard range of heat sinks that are also provided with multiple heat pipe receiving grooves, will make it possible to combine freely different numbers and designs of heat sinks and heat pipes, as is shown in the exemplary embodiments of FIGS. 6A-G. In this case, it may also be practical to pre-apply the TIM to the heat sink profile before cutting it up into the modular sizes. It shall be noted that the schematic illustrations in the drawing figures do not specifically show designs of heat sinks that are intended for extrusion, but only generally illustrate the principles of the invention. Therefore, heat sinks that are adapted to extrusion techniques may have a slightly different actual design.

Figure 6A:
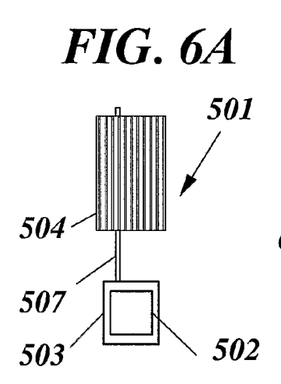
FIGS. 6A-G schematically illustrate further alternative embodiments of the inventive cooling assembly.
Figure 6B:
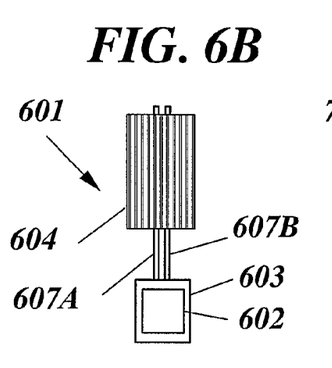
Figure 6C:
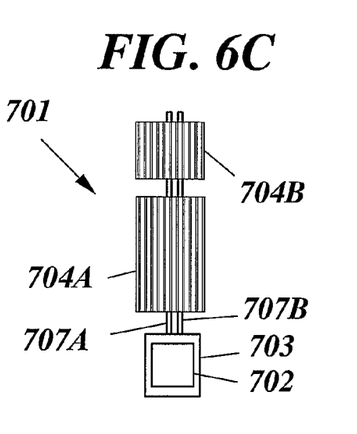
Figure 6D:
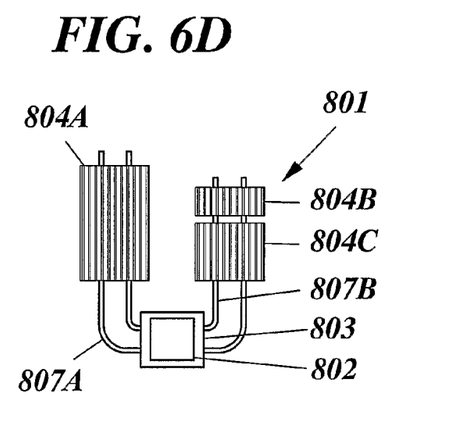
Figure 6E:
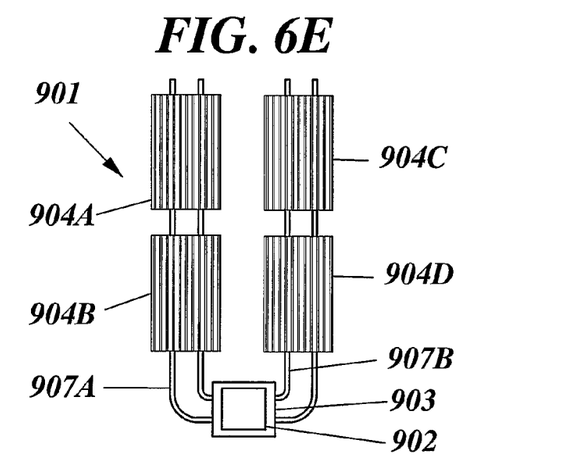
Figure 6F:
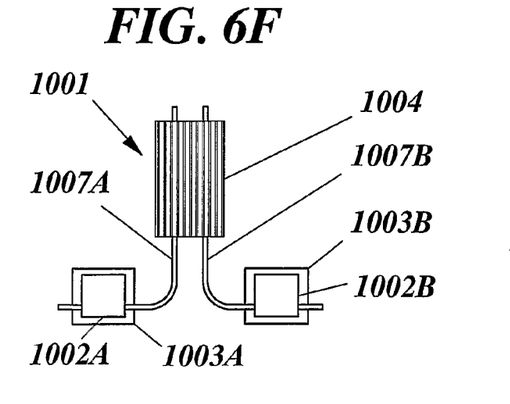
Figure 6G:
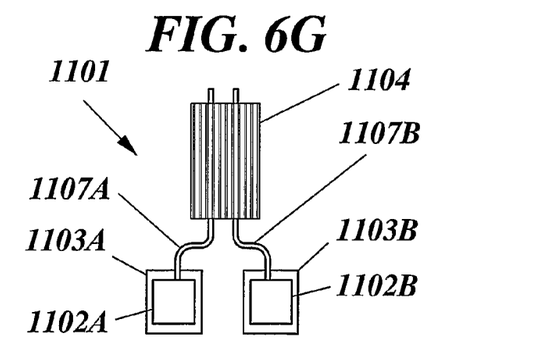

FIGS. 6A, 6B and 6C illustrate that in addition to the previously illustrated embodiments employing curved heat pipes, the cooling assembly 501, 601, 701 of the invention may naturally also be formed using one or several straight heat pipes 507, 607A, 607B and 707A, 707B, respectively. In FIGS. 6C-6E is likewise illustrated that more than one heat sink 704A, 704B, 804A-C and 904A-D may be mounted along the same heat pipe or heat pipes 707A-B, 807A-B and 907A-B, respectively. FIGS. 6D and 6E also illustrate the use of U-shaped heat pipes 807A-B and 907A-B, respectively, having heat sinks at both ends to double the cooling capacity. FIGS. 6F and 6G illustrate that the cooling assembly 1001 and 1101, respectively of the invention may be used for cooling several heat generating components 1003A, 1003B and 1103A, 1103B, respectively. In the illustrated embodiments heat is transferred from two heat-generating electronic components 1003A, 1003B; 1103A, 1103B and to a common heat sink 1004 and 1104, respectively, by separate heat pipes 1007A, 1007B; 1107A, 1107B. In this case curved and or S-shaped heat pipes 1007A-B and 1107A-B are preferably used.

Figure 7A:
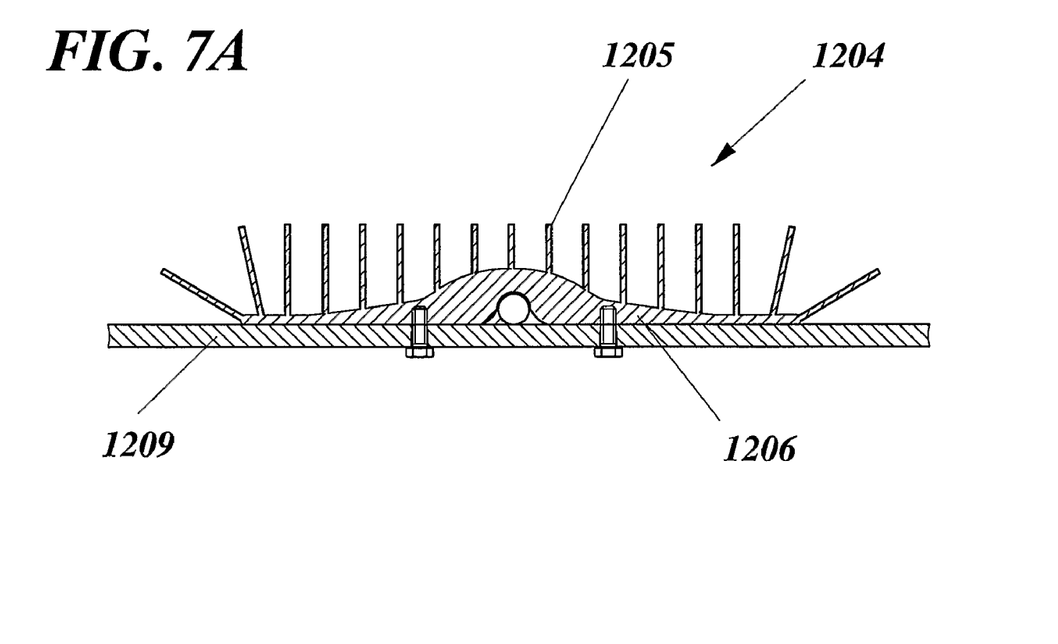
FIGS. 7A-B illustrate further exemplifying embodiments of heat sinks for use in cooling assemblies according to the invention.
Figure 7B:
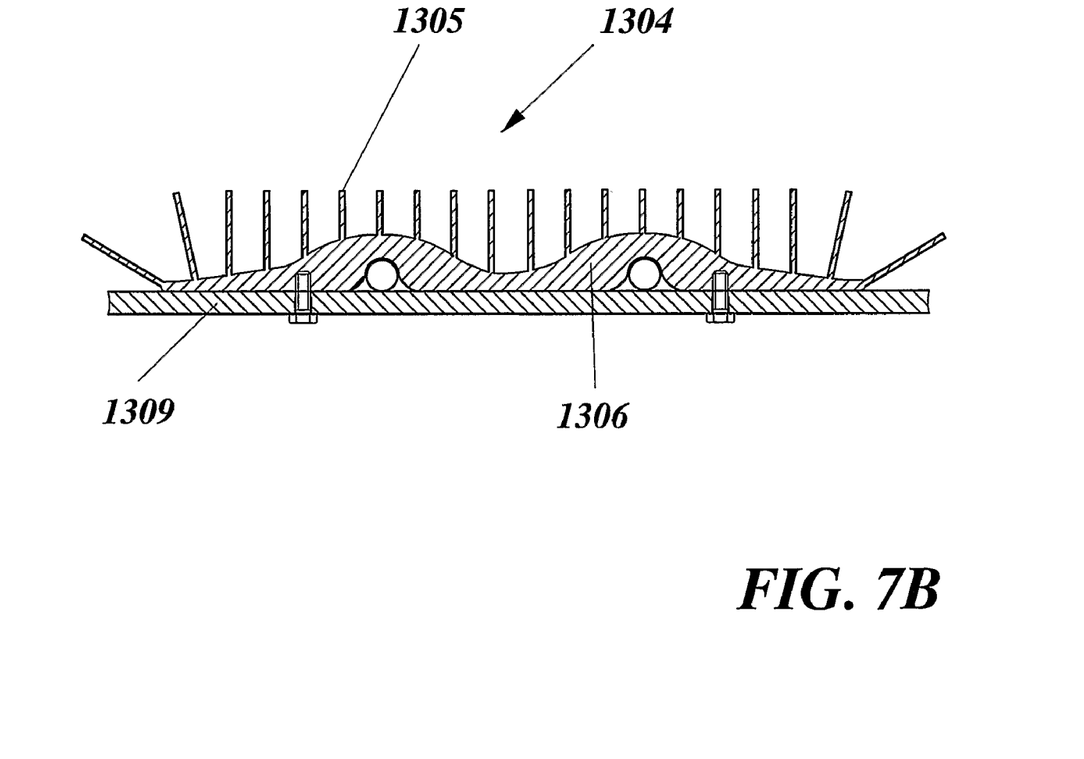

Finally, FIGS. 7A-B schematically illustrate examples of further variations of the heat sink modules 1204, 1304 of the cooling assembly according to the invention. In both these examples, the heat sink 1204, 1304 is formed having a body 1206, 1306 that is thicker in the area where the heat pipes are located and thinner in all other areas. As is illustrated, this variant may be applied to heat sinks 1204, 1304 having one or several grooves for receiving the corresponding heat pipes. Such variants are well suited for the above discussed extrusion of the heat sinks, since the costs for making an extrusion die even for a rather complex cross-section shape, is very reasonable.

In alternative, but not specifically illustrated embodiments of the invention variations of the different illustrated parts of the cooling assembly may be employed without departing from the scope of the invention. One example thereof is the use of a thin "heat plane" instead of heat pipe. A heat plane is similar in function to a heat pipe. Heat planes can be made very thin, less than 2 mm, one or several such heat planes may be squeezed between a circuit board and the heat sink in a similar way as heat pipes of the invention. Heat planes are much more expensive than heat pipes today but may be considered as an economical alternative in the future.

In another advantageous alternative solution, the thermal interface material TIM is pre-applied to the grooves of the heat sinks. Preferably, in the above described embodiment where heat sinks are cut up from extruded profiles, the TIM is also applied to the extruded profile before cutting it up into the individual heat sinks.

Specifically, the invention also covers the possibility of providing a range of heat sinks for all applications, said heat sinks being provided with multiple grooves to be prepared for multiple heat pipes, even though only one or a few grooves may be used for a specific application. The circuit board can also allow for thermal connection from the heat pipe to the power/ground planes and thereby contribute as an additional area extension.

Although the invention has been described and illustrated with specific reference to an application for cooling a chip package, the invention is in no way restricted to such applications. The basic principles of the invention may be applied to provide cooling for any "Hot Spot" on a circuit board.

The invention has been described in connection with what is presently considered the most practical and preferred embodiments, but it is to be understood that the invention is not limited to the disclosed embodiments. The invention is therefore intended to cover various modifications and equivalent arrangements included within the spirit and scope of the appended claims.

The invention claimed is:

1. A method of cooling at least one heat-generating electronic component mounted on a circuit board, said method comprising the steps of:
   attaching a heat collector to the component;
   placing at least one heat pipe in direct thermal contact with the heat collector to remove heat from the heat collector and move the heat to a location which is distant from the electronic component; and
   mounting to the circuit board at the distant location, at least one heat sink having at least one groove formed on an underside thereof, wherein the at least one heat sink is mounted so that it overlies the heat pipe and the heat pipe is introduced into the groove, thereby securing the heat pipe between the heat sink and the circuit board.

2. The method as recited in claim 1, wherein the at least one groove in the at least one heat sink has a wall, and the groove is sized so that the heat pipe is in direct thermal contact with the wall when the heat pipe is secured between the heat sink and the circuit board.

3. The method as recited in claim 2, wherein the at least one groove extends for the entire length of the at least one heat sink, and the step of mounting at least one heat sink to the circuit board includes aligning and mounting multiple heat sinks to the circuit board so that the groove in each heat sink is aligned with the groove in an adjacent heat sink, wherein each heat sink overlies a different portion of the heat pipe and secures the respective portion of the heat pipe to the circuit board.

4. The method as recited in claim 2, wherein a plurality of heat pipes remove heat from the heat collector, and the step of mounting at least one heat sink to the circuit board includes mounting multiple heat sinks to the circuit board so that the groove in each heat sink is aligned with a different one of the heat pipes, wherein each heat sink overlies a different heat pipe and secures the respective heat pipe to the circuit board.

5. The method as recited in claim 2, wherein a plurality of heat pipes remove heat from the heat collector, and the heat sink has a plurality of grooves formed on an underside thereof, wherein the step of mounting at least one heat sink to the circuit board includes mounting the heat sink to the circuit board so that the plurality of grooves is aligned with a different one of the heat pipes, wherein the heat sink overlies the plurality of heat pipes and secures the heat pipes to the circuit board.

6. The method as recited in claim 5, further comprising transferring heat from a plurality of heat-generating electronic components to the at least one heat sink.

7. The method as recited in claim 2, wherein the step of mounting at least one heat sink to the circuit board also includes mounting the heat sink to the circuit board so that the heat pipe is in direct thermal contact with the circuit board.

8. The method as recited in claim 2, wherein the step of mounting at least one heat sink to the circuit board includes mounting a heat sink having grooves of different sizes to secure heat pipes of different sizes to the circuit board.

9. The method as recited in claim 2, further comprising pre-applying a thermal interface material to the groove in the heat sink prior to mounting the heat sink to the circuit board.

10. A cooling assembly for cooling at least one heat-generating electronic component mounted on a circuit board, said cooling assembly comprising:
    a heat collector attached to the heat-generating electronic component;
    at least one heat pipe placed in direct thermal contact with the heat collector to remove heat from the heat collector and move the heat to a location which is distant from the electronic component; and
    at least one heat sink mounted to the circuit board at the distant location, said heat sink having at least one groove formed on an underside thereof, wherein the at least one heat sink is mounted so that it overlies the heat pipe and the heat pipe is introduced into the groove, thereby securing the heat pipe between the heat sink and the circuit board.

11. The cooling assembly as recited in claim 10, wherein the at least one groove in the at least one heat sink has a wall, and the groove is sized so that the heat pipe is in direct thermal contact with the wall when the heat pipe is secured between the heat sink and the circuit board.

12. The cooling assembly as recited in claim 11, wherein the at least one groove extends for the entire length of the at least one heat sink, and the cooling assembly includes a plurality of heat sinks aligned and mounted to the circuit board so that the groove in each heat sink is aligned with the groove in an adjacent heat sink, wherein each heat sink overlies a different portion of the heat pipe and secures the respective portion of the heat pipe to the circuit board.

13. The cooling assembly as recited in claim 11, wherein a plurality of heat pipes remove heat from the heat collector, and the cooling assembly includes a plurality of heat sinks mounted to the circuit board so that the groove in each heat sink is aligned with a different one of the heat pipes, wherein each heat sink overlies a different heat pipe and secures the respective heat pipe to the circuit board.

14. The cooling assembly as recited in claim 11, wherein a plurality of heat pipes remove heat from the heat collector, and the heat sink has a plurality of grooves formed on an underside thereof, wherein the heat sink is mounted to the circuit board so that the plurality of grooves is aligned with a different one of the heat pipes, wherein the heat sink overlies the plurality of heat pipes and secures the heat pipes to the circuit board.

15. The cooling assembly as recited in claim 14, further comprising a plurality of heat collectors attached to a plurality of heat-generating electronic components, wherein the plurality of heat pipes are arranged to remove heat from the plurality of heat collectors and to transfer the heat to the at least one heat sink.

16. The cooling assembly as recited in claim 14, wherein the plurality of grooves is aligned parallel to cooling fins on a top side of the heat sink.

17. The cooling assembly as recited in claim 11, wherein the heat sink is mounted to the circuit board so that the heat pipe is in direct thermal contact with the circuit board.

18. The cooling assembly as recited in claim 11, wherein the heat sink has grooves of different sizes to secure heat pipes of different sizes to the circuit board.

19. The cooling assembly as recited in claim 11, further comprising a thermal interface material applied to the groove in the heat sink.

20. The cooling assembly as recited in claim 11, wherein the at least one heat sink includes:
  an upper part having the groove formed on the underside thereof; and
  a lower part that connects to the upper part through an aperture in the printed circuit board;
  wherein at least a portion of the heat pipe is secured between the upper part and the lower part of the heat sink.

21. The cooling assembly as recited in claim 11, wherein the at least one heat pipe includes a curved portion.

22. The cooling assembly as recited in claim 11, wherein the cooling assembly includes a plurality of heat sinks cut into different lengths from one single profile of a metallic material.

23. A method of designing and manufacturing a cooling assembly for cooling at least one heat-generating electronic component mounted on a circuit board, said method comprising the steps of:
  selecting a heat collector;
  attaching the heat collector to the component;
  selecting at least one heat pipe;
  placing the at least one heat pipe in direct thermal contact with the heat collector to remove heat from the heat collector and move the heat to a location which is distant from the electronic component; and
  designing at least one heat sink having at least one groove formed on an underside thereof; and
  mounting to the circuit board at the distant location, the at least one heat sink, wherein the at least one heat sink is mounted so that it overlies the heat pipe and the heat pipe is introduced into the groove, thereby securing the heat pipe between the heat sink and the circuit board.

24. The method as recited in claim 23, wherein the step of selecting a heat collector includes the steps of:
  calculating a cooling capacity required for each heat-generating electronic component; and
  based on the calculated required cooling capacity for each component, designing a heat sink for each component from a standard range of heat collector sizes and designs.

25. The method as recited in claim 23, wherein the step of selecting a heat pipe includes the steps of:
  calculating a cooling capacity required for each heat-generating electronic component; and
  based on the calculated required cooling capacity for each component, selecting a heat pipe for each component from a standard range of heat pipe sizes and designs.

26. The method as recited in claim 23, wherein the step of designing a heat sink includes the steps of:
  calculating a cooling capacity required for each heat-generating electronic component; and
  based on the calculated required cooling capacity for each component, designing a heat sink having a groove formed on the underside thereof for receiving each heat pipe.

27. The method as recited in claim 23, wherein the step of designing a heat sink includes the steps of:
  calculating a cooling capacity required for each heat-generating electronic component;
  based on the calculated required cooling capacity for each component, selecting a heat sink from a standard range of heat sink sizes and designs; and
  modifying the heat sink with a groove formed on the underside thereof for receiving each heat pipe.

28. The method as recited in claim 27, wherein the step of modifying the heat sink with a groove formed on the underside thereof includes modifying the heat sink with grooves of different sizes to receive heat pipes of different standard dimensions.

29. The method as recited in claim 27, wherein the step of modifying the heat sink with a groove formed on the underside thereof includes forming curved grooves in the heat sink to accommodate heat pipes having a curved portion and/or U-shaped heat pipes and/or S-shaped heat pipes.

\* \* \* \* \*

UNITED STATES PATENT AND TRADEMARK OFFICE
CERTIFICATE OF CORRECTION

PATENT NO. : 7,545,646 B2
APPLICATION NO. : 11/917669
DATED : June 9, 2009
INVENTOR(S) : Holmberg et al.

It is certified that error appears in the above-identified patent and that said Letters Patent is hereby corrected as shown below:

On the Title Page, in Field (57), under "ABSTRACT", in Column 2, Line 7, after "so that" delete "is" and insert -- it --, therefor.

Signed and Sealed this

Seventeenth Day of November, 2009

David J. Kappos
*Director of the United States Patent and Trademark Office*